US 8,205,783 B2

(12) United States Patent
Ohtashiro et al.

(10) Patent No.: US 8,205,783 B2
(45) Date of Patent: Jun. 26, 2012

(54) SOLDERING APPARATUS

(75) Inventors: Tadayoshi Ohtashiro, Saitama (JP); Hiroyuki Inoue, Saitama (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 13/083,426

(22) Filed: Apr. 8, 2011

(65) Prior Publication Data

US 2011/0248068 A1  Oct. 13, 2011

(30) Foreign Application Priority Data

Apr. 9, 2010  (JP) .................................. 2010-90969

(51) Int. Cl.
*B23K 37/00*  (2006.01)
*B23K 31/02*  (2006.01)
(52) U.S. Cl. .............................. 228/8; 228/9; 228/234.1
(58) Field of Classification Search .................. None
See application file for complete search history.

(56) References Cited

U.S. PATENT DOCUMENTS

| 4,446,358 A | * | 5/1984 | Comerford et al. | ............ 219/388 |
| 4,696,096 A | * | 9/1987 | Green et al. | ..................... 29/829 |
| 4,698,774 A | * | 10/1987 | Abe et al. | ...................... 700/212 |
| 4,832,249 A | * | 5/1989 | Ehler | ........................... 228/102 |
| 5,320,274 A | * | 6/1994 | Precious et al. | ................ 228/37 |
| 5,333,774 A | * | 8/1994 | Mishina et al. | ................ 228/46 |
| 5,467,914 A | * | 11/1995 | Peterson et al. | ............. 228/102 |
| 6,168,065 B1 | * | 1/2001 | Willemen | ......................... 228/9 |
| 6,619,953 B2 | * | 9/2003 | Yamaoka et al. | ............. 432/128 |
| 2001/0011197 A1 | * | 8/2001 | White | .............................. 700/96 |
| 2002/0060235 A1 | * | 5/2002 | Nagafuku et al. | ............. 228/10 |
| 2002/0146657 A1 | * | 10/2002 | Anderson et al. | ............... 432/11 |
| 2003/0213833 A1 | * | 11/2003 | Nakamura et al. | ............. 228/256 |
| 2004/0163241 A1 | * | 8/2004 | White | .............................. 29/832 |
| 2005/0173497 A1 | * | 8/2005 | Dokkedahl | .................... 228/219 |
| 2006/0027907 A1 | * | 2/2006 | Odegard et al. | ................ 257/685 |
| 2006/0162154 A1 | * | 7/2006 | White | .............................. 29/832 |
| 2007/0254255 A1 | * | 11/2007 | Neville et al. | ................. 432/121 |
| 2010/0082153 A1 | * | 4/2010 | Sonoyama | ..................... 700/229 |

FOREIGN PATENT DOCUMENTS

DE  3635448 C1  1/1988
GB  2347021 A  8/2000
(Continued)

OTHER PUBLICATIONS

Petio Batev, European Search Report for EP 11161781, Dec. 21, 2011.

*Primary Examiner* — Kiley Stoner
(74) *Attorney, Agent, or Firm* — Chernoff, Vilhauer, McClung & Stenzel (57) ABSTRACT

In a reflow soldering apparatus, when changing the operation mode from a production mode to a temperature profile mode, a warning-issue-time is set to a point of time (for example, several seconds) before the circuit board reaches an exit of the main body of the soldering apparatus to issue an alarm at this set time. A control unit thereof calculates a period of time when the alarm issues based on the set warning-issue-time before circuit-board-discharge and the like. After a sensor of entrance side has detected that the circuit board enters into main body of the reflow soldering apparatus, the control unit determines whether or not the starting time of the alarm sound has been elapsed. The control unit controls the information unit to sound the alarm when the control unit determines that the starting time of the warning issue has elapsed.

12 Claims, 9 Drawing Sheets

FOREIGN PATENT DOCUMENTS

| | | | |
|---|---|---|---|
| JP | 04-356352 A | * | 12/1992 |
| JP | 05-055743 A | * | 3/1993 |
| JP | 2004-064002 | | 2/2004 |
| JP | 2004247519 A | | 9/2004 |

* cited by examiner

SOLDERING APPARATUS

CROSS REFERENCES TO RELATED APPLICATIONS

The present invention contains subject matter related to Japanese Patent Application JP 2010-090969 filed in the Japanese Patent Office on Apr. 9, 2010, the entire contents of which being incorporated herein by reference.

BACKGROUND OF THE INVENTION

1. Field of the Invention

The present invention relates to a soldering apparatus that solders electronic components on a circuit board. It particularly relates to a soldering apparatus which has an operation mode including a production mode that solders an electronic component on a circuit board and a temperature profile mode that measures a temperature of the circuit board carried in a main body of the soldering apparatus.

2. Description of Related Art

When soldering the electronic components on a printed circuit board, a reflow soldering apparatus is generally used. Such a reflow soldering apparatus includes a conveyor conveying the printed circuit boards and a main body of the reflow soldering apparatus into which the conveyor conveys the print circuited boards. The main body of the reflow soldering apparatus is partitioned into a preliminary heating zone, a main heating zone and a cooling zone therein. The printed circuit board on which solder paste has been previously printed is first subjected to the preliminary heating in the preliminary heating zone. In the printed circuit board subjected to the preliminary heating, the solder paste is melted in the main heating zone. Next, the cooling zone cools the printed circuit board, thereby soldering the electronic components on the printed circuit board.

Thus, in the reflow soldering apparatus, it is hopeful of controlling the preliminary heating zone, the main heating zone and the cooling zone respectively according to their optimal temperature profiles. Further, it is hopeful of managing a heating temperature and a period of heating time suitably in the main heating zone so that the temperature therein does not exceed the allowable temperature limits of the solder paste, the electronic components, the printed circuit board and the like. Therefore, in the reflow soldering apparatus, a user measures a temperature profile for verifying whether or not the temperature in each of the zones of the reflow soldering apparatus is best.

The temperature profile is measured by connecting a printed circuit board mounting a thermocouple, storage medium or the like (hereinafter, referred to as "profiler circuit board") to a printed circuit board which is subjected to the measurement (hereinafter, referred to as "printed circuit board to be measured"), carrying them into the reflow soldering apparatus with the printed circuit board to be measured being at the head of them, and measuring any changes in temperature at measuring points in each zone by the thermocouple or the like. The storage medium mounted on the profiler circuit board stores information thus obtained, and a computer reads various kinds of information out of the storage medium mounted on the profiler circuit board after the reflow processing and utilizes the various kinds of information for setting the reflow soldering apparatus. The verification is repeated while altering any heating conditions of the reflow soldering apparatus one by one until a desired result of the temperature measurement under the temperature profile at each measurement point is obtained so that any suitable reflow conditions are set.

For example, Japanese Patent Application Publication No. 2004-64002 has proposed, as a measuring method of the temperature profile, a thermal analysis method that can find out heating condition of the heating device efficiently without using any property values of an object to be heated. According to this thermal analysis method, it is possible to perform highly accurate simulation within a short time, without actually measuring the temperature profile of the object to be heated by the correction of the heat condition.

SUMMARY OF THE INVENTION

The past reflow soldering apparatus disclosed in Japanese Patent Application Publication No. 2004-64002 or the like, however, has the following problems (1) through (3).

(1) In the past reflow soldering apparatus, a measurement of the temperature profile is performed in a common production mode that carries out reflow processing. In this common production mode, it is not necessary that the circuit board which has been subjected to reflow processing and will be discharged from the reflow soldering apparatus is taken out for being transferred to an apparatus of a next step at the same time when being discharged from the reflow soldering apparatus. On the other hand, the temperature profile measurement has an object to measure the temperature of the circuit board in the reflow soldering apparatus so that it is necessary that the circuit board is taken out at the same time when being discharged from the reflow soldering apparatus. This is because the circuit board is transferred to the next stage if the circuit board is leaves as it is. Since, however, the past reflow soldering apparatus is made on the assumption of the production mode, the apparatus is not provided with any means for informing a user that the circuit board is discharged from the reflow soldering apparatus at the same time when the circuit board is discharged from the reflow soldering apparatus. Thus, in the past temperature profile measurement, the user cannot know when the circuit board is discharged from the reflow soldering apparatus after the circuit board has once entered into the reflow soldering apparatus so that the user cannot be separated apart from a side of the reflow soldering apparatus until the circuit board is discharged from the reflow soldering apparatus.

(2) Further, in the temperature profile measurement, since the profiler circuit board is connected with the printed circuit board to be measured, a sensor mounted on an entrance of the reflow soldering apparatus may detect the profiler circuit board and the printed circuit board to be measured as one continued unit. Therefore, a longer period of detecting time by the sensor than that of detecting the circuit board itself in the common production mode is required so that the reflow soldering apparatus may recognize in error that the circuit board stagnates near the entrance. In this case, an alarm is informed as circuit-board-stagnating error.

(3) Additionally, in the temperature profile measurement, since the profiler circuit board is connected with the printed circuit board to be measured, if taking the printed circuit board to be measured when the printed circuit board to be measured reaches the exit of the reflow soldering apparatus, the profiler circuit board following the printed circuit board to be measured is also taken out together with the printed circuit board to be measured. In this moment, the sensor at the entrance side detects the entrances of two times by the profiler circuit board and the printed circuit board to be measured while the sensor at the exit side detects only the printed circuit board to be measured because the profiler circuit board is also taken out at the same time of taking the printed circuit board to be measured so that the reflow soldering apparatus may recognize in error that the profiler circuit board falls downward from a conveyor line. In this case, an alarm is informed as circuit-board-falling error.

Thus, the present invention solves the above-mentioned problems and it has an object to provide a soldering apparatus that allows to be avoided any mistakes of a carry of the circuit board, mistakes of the measurement and a malfunction of an alarm system when measuring the temperature profile of the soldering apparatus.

According to an embodiment of the present invention, there is provided a soldering apparatus. The soldering apparatus contains an operation mode including a production mode that solders an electronic component on a circuit board and a temperature profile mode that measures a temperature of the circuit board carried in a main body of the soldering apparatus. The soldering apparatus comprises the main body, an information means that informs warning, an operation unit that sets a starting time of the warning issue by the information means, a sensor that detects the circuit board carried into the main body of the soldering apparatus, the sensor being provided near an entrance of the main body of the soldering apparatus, and a control unit that determines whether or not the starting time of the warning issue by the information means, the starting time being set by the operation unit, has come, on the basis of a detection result detected by the sensor. In the temperature profile mode, the control unit controls the information means to issue the warning when the control unit determines that the starting time of the warning issue has come.

In the embodiment of the apparatus relating to the present invention, the soldering apparatus contains the operation mode including the production mode that solders the electronic component(s) on the circuit board using solder paste and the temperature profile mode that measures the temperature of the circuit board in the main body of the soldering apparatus. When the operation unit changes the operation mode to the temperature profile mode, the operation unit sets a starting time of the warning issue by the information means. The starting time is set to a point of time, for example, (several seconds) before the circuit board reaches an exit of the main body of the soldering apparatus, i.e., how long it will take until the circuit board reaches an exit of the main body of the soldering apparatus. The warning by the information means includes an alarm such as a buzzer or an alarm voice, a light emitting from a patrol light, a vibration by a vibration device and an alarm representation on a display screen.

Then, when changing the operation mode to the temperature profile mode and starting the temperature profile measurement, the sensor provided near the entrance of the main body of the soldering apparatus detects whether or not the circuit board is entered into the main body of the soldering apparatus. When receiving the detection signal from the sensor, the control unit determines whether or not the starting time of the warning has elapsed on the basis of the detection time. When the control unit determines that the starting time of the warning has elapsed, the control unit controls the information means to issue the warning to inform a user that the circuit board is coming up to the exit of the main body of the soldering apparatus.

Thus, according to the embodiment of the invention, in the temperature profile mode, the soldering apparatus informs the user that the circuit board is coming up to the exit of the main body of the soldering apparatus by the information means such as the alarm sound before the circuit board has reached the exit of the main body of the soldering apparatus so that the user may take the circuit board out of the main body of the soldering apparatus surely when the circuit board reaches the exit of the main body of the soldering apparatus. This allows to be avoided any mistakes of a carry of the circuit board to a next step, and a careless mistakes of the profile measurement by the user.

The concluding portion of this specification particularly points out and directly claims the subject matter of the present invention. However, those skilled in the art will best understand both the organization and method of operation of the invention, together with further advantages and objects thereof, by reading the remaining portions of the specification in view of the accompanying drawing(s) wherein like reference characters refer to like elements.

DESCRIPTION OF THE PREFERRED EMBODIMENTS

The following will describe embodiments of the invention with reference to drawings.

[Configuration Example of Reflow Soldering Apparatus]

Figure 1:
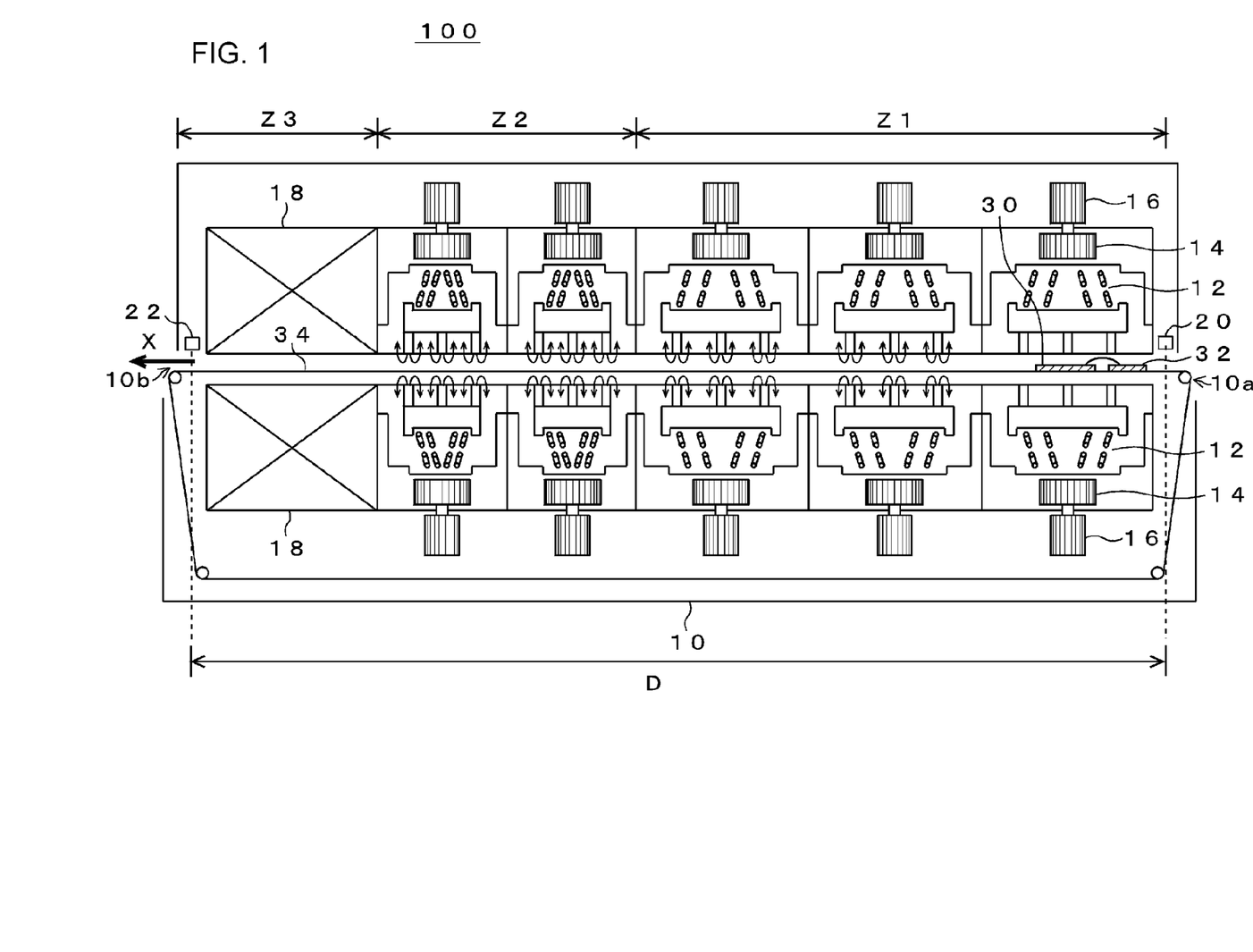
FIG. 1 is a diagram showing a configuration example of a reflow soldering apparatus as an embodiment of the invention.

FIG. 1 shows a configuration example of a reflow soldering apparatus 100 as an embodiment of the invention. The reflow soldering apparatus 100 according to the invention contains an operation mode including at least a production mode and a temperature profile mode. In the temperature profile mode, an alarm is issued before a circuit board 30 carried within a main body 10 of the reflow soldering apparatus 100 reaches an exit 10b of the reflow soldering apparatus 100.

As shown in FIG. 1, the reflow soldering apparatus 100 contains the main body 10 thereof, heaters 12, fans 14, motors 16, cooling devices 18, a sensor 20 of entrance side, a sensor 22 of exit side and a conveyor 34. The main body 10 of the reflow soldering apparatus 100 is formed of a tunnel-like housing including the entrance 10a and the exit 10b. The conveyor 34 extends along a carrying direction X of the circuit board from the entrance 10a to the exit 10b. The conveyor 34 conveys the circuit boards at a predetermined speed from the entrance 10a of the main body 10 of the reflow soldering apparatus 100 to the exit 10b thereof.

The sensor 20 of entrance side is mounted near the entrance 10a of the main body 10 of the reflow soldering apparatus 100. The sensor 20 of entrance side detects the circuit board 30 and/or a temperature profile board 32 when the conveyor 34 conveys it/them into the main body 10 of the reflow soldering apparatus 100. The sensor 22 of exit side is mounted near the exit 10b of the main body 10 of the reflow soldering apparatus 100. The sensor 22 of exit side detects the circuit board 30 and/or a temperature profile board 32 when the conveyor 34 conveys and discharges it/them to the outside from the main body 10 of the reflow soldering apparatus 100.

The inside of the main body 10 of the reflow soldering apparatus 100 is partitioned into three zones, namely, a preliminary heating zone Z1, a heating zone Z2 and a cooling zone Z3, along the carrying direction X of the circuit board. The preliminary heating zone Z1 is a zone for volatilizing any solvent from solder paste and is formed of heaters 12, fans 14, motors 16 and the like. As the solder paste, any lead-free solder containing tin-silver-copper or tin-zinc-bismuth may be used. Such solder paste has a melting range of, for example, about 180° C. through 220° C. The main heating zone Z2 is a zone for melting the solder by heating the circuit board 30, with which heaters 12, fans 14, motors 16 and the like are equipped. It is to be noted that although heaters 12, fans 14 and motors 16, which have different configurations, may be used in the preliminary heating zone Z1 and the main heating zone Z2, the following will be described using the heaters 12, the fans 14 and the motors 16, which respectively have the same configuration because the heaters 12, the fans 14 and the motors 16 respectively have the same essential configurations and functions.

Pairs of the heaters 12 are disposed on upper and lower positions of the conveyor 34 so that the heaters are opposed and heat air within the preliminary heating zone Z1 and the main heating zone Z2. In this embodiment, as shown in FIG. 1, three pairs of the heaters 12 are disposed on upper and lower positions of the conveyor 34 in the preliminary heating zone Z1 and two pairs of the heaters 12 are disposed on upper and lower positions of the conveyor 34 in the main heating zone Z2.

Pairs of the motors 16 are disposed on upper and lower positions of the conveyor 34 so that the motors are opposed and respectively rotate the fans 14 positioned in each zone. In this embodiment, as shown in FIG. 1, three pairs of the motors 16 are disposed on upper and lower positions of the conveyor 34 in the preliminary heating zone Z1 and two pairs of the motors 14 are disposed on upper and lower positions of the conveyor 34 in the main heating zone Z2.

Each of the fans 14 is composed of, for example, a air-supplying fan such as a turbofan or a sirocco-fan and is electrically connected to the motor 16. Each of the fans 14 rotates by the rotation of each of the motors 16 and circulates air heated by each of the heaters 12 within the preliminary heating zone Z1 and the heating zone Z2 to blow the heated air to each of the upper and lower surfaces of the circuit board 30. In this embodiment, three pairs of the fans 14 are disposed on upper and lower positions of the conveyor 34 in the preliminary heating zone Z1 and two pairs of the fans 14 are disposed on upper and lower positions of the conveyor 34 in the main heating zone Z2.

The cooling zone Z3 is a zone for cooling the circuit board 30, which has been heated in the main heating zone Z2, down rapidly to solidify the melted solder and contains cooling devices 18. Each of the cooling devices 18 includes cooling member, a fan and a motor. The fan and the motor have a configuration and a function which are almost like those of the fans 14 and the motors 16 used in the preliminary heating zone Z1 and the main heating zone Z2. Such a configuration enables air cooled by the cooling devices 18 to be blown to the upper and lower surfaces of the circuit board 30 respectively so that the circuit board 30 is cooled.

Figure 2:
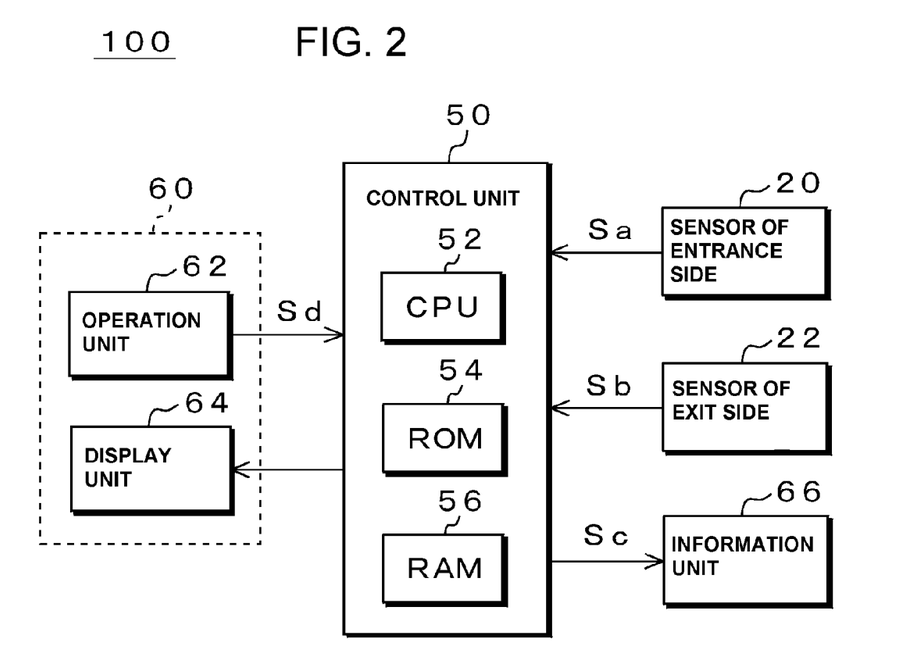
FIG. 2 is a block diagram showing a configuration of the reflow soldering apparatus.

The following will describe the configuration of the reflow soldering apparatus 100 with reference to the block diagram of FIG. 2. As shown in FIG. 2, the reflow soldering apparatus 100 contains a control unit 50, the sensor 20 of entrance side, the sensor 22 of exit side, an information unit 60 and operation and display units 60.

The sensor 20 of entrance side is composed of, for example, an optical sensor and detects the circuit board 30 entering into the entrance 10a of the main body 10 of the reflow soldering apparatus 100 to supply a detection signal Sa to the control unit 50. The sensor 22 of exit side is composed of, for example, an optical sensor and detects the circuit board 30 discharged from the exit 10b of the main body 10 of the reflow soldering apparatus 100 to supply a detection signal Sb to the control unit 50.

The information unit 66 as an information means is composed of, for example, a speaker and issues an alarm such as a buzzer or an alarm voice, based on any output instruction from the control unit 50. For example, in the production mode, an alarm is issued when the circuit board 30 is stagnant within the main body 10 of the soldering apparatus 100 and/or the circuit board 30 is fallen from a conveying way within the main body 10 of the soldering apparatus 100. In the temperature profile mode,
an alarm is issued for informing a user that the circuit board 30 is coming up to the exit 10b of the main body 10 of the soldering apparatus 100 before the circuit board 30 reaches the exit 10b. As the information unit 66 as an information means, a light-emitting device that inform the user of such warning using a light emitting from, for example, a patrol light, may be used other than the speaker. Further, a display device that inform the user of such warning by displaying any warning representation on a screen may be used. As the display device, a display unit 64, which will be described later, may be also used. As the information unit 66, a vibration device may be used. In this case, the user holds the vibration device and when the circuit board 30 is coming up to the exit 10b of the main body 10 of the soldering apparatus 100, the control unit 50 sends a driving signal to the vibration device to vibrate the vibration device, thereby informing the user that the circuit board 30 is coming up to the exit 10b of the main body 10 of the soldering apparatus 100.

The operation and display units 60 include an operation unit 62 and a display unit 64. The operation unit 62 is composed of, for example, a keyboard, a mouse, a touch panel input device and the like and produces an operation signal Sd based on any input information input by the user to supply it to the control unit 50. For example, the user sets a carrying speed of a conveyor 34, set temperature of each zone, size of the circuit board 30 and the like on the operation unit 62. If the alarm is issued before the circuit board 30 reaches the exit 10b like the temperature profile mode, the user inputs an alarm-issue-point-of-time Td2 before circuit-board-discharge, indicating how many time (seconds) does the alarm issue before the circuit board reaches the exit 10b of the main body of the soldering apparatus.

The display unit 64 is composed of, for example, liquid crystal display or an organic electroluminescent display and displays a reflow-soldering-apparatus-control screen 64a (FIG. 3) for setting various kinds of conditions such as a temperature of the reflow soldering apparatus, a speed of the conveyor therein, which will be described later and a mode-changing sub-screen 70a (FIG. 4) for changing the operation mode from the production mode to the temperature profile mode and vice versa.

In this embodiment of the reflow soldering apparatus 100, the operation and display units 60 of a touch screen type combining the operation unit 62 and the display unit 64 integrally is used. The operation and display units 60 is installed on, for example, a casing at a front of the reflow soldering apparatus 100 shown in FIG. 1.

The control unit 50 includes a central processing unit (CPU) 52, a read only memory (ROM) 54, a random access memory (RAM) 56. The CPU 52 reads any control programs recorded in the ROM 54 to expand them on the RAM 56 and carries out the expanded control programs to control various parts of the reflow soldering apparatus 100. The control unit 50 also controls any drives of the heaters and/or motors based on an input information (operation signals) from the reflow-soldering-apparatus-control screen 64a, which will be described later, displayed on the display unit 64. The control unit 50 controls the parts to perform various kinds of processing in the production mode or the temperature profile mode based on the user's mode change operation performed on the mode-changing sub-screen 70a which is displayed on the display unit 64. Here, the production mode is referred to as a common mode that solders an electronic component on a circuit board. The temperature profile mode is referred to as a mode that measures a temperature of the circuit board carried in the main body of the soldering apparatus and carried out before a start of the production mode or in an interval between the operations in the production mode.

When the control unit 50 receives the detection signals Sa, Sb based on the detection of the circuit board 30 from the sensor 20 of entrance side and the sensor 22 of exit side, the control unit 50 controls the information unit 66 based on the detection signals Sa, Sb to issue an alarm. For example, in the production mode, the control unit 50 controls the information unit 66 to issue an alarm by supplying an output signal Sc to the information unit 66 when detecting any errors by a fallen-circuit-board-detection function or a stagnant-circuit-board-detection function, which will be described later. In the temperature profile mode, the control unit 50 controls the information unit 66 to issue an alarm before the circuit board reaches the exit 10b. The user may set a timing of issuing the alarm at will. For example, it is desirable to set a timing such that when the circuit board 30 reaches the exit 10b of the reflow soldering apparatus 100 in the temperature profile mode, the user who works around the reflow soldering apparatus 100 can move to the exit 10b surely.

When the control unit 50 receives an operation signal Sd, which is used for changing the operation mode to the temperature profile mode, from the operation unit 62, the control unit 62 turns off a ready signal to be supplied to an apparatus provided on a preceding stage of the main body 10 of the soldering apparatus 100. As the apparatus provided on a preceding stage of the main body 10 of the soldering apparatus 100, a solder printing machine that prints the circuit board using solder paste or a chip mounter that mounts electronic components on joint portions of lines printed using the solder paste are used. The ready signal is referred to as a signal that is supplied to an apparatus provided on a preceding stage of the main body 10 of the soldering apparatus 100 and indicates whether or not the circuit board 30 supplied from the apparatus provided on a preceding stage of the main body 10 of the soldering apparatus 100 to the reflow soldering apparatus 100 is allowed to be carried. In the production mode, this ready signal is always turned on so that the circuit boards 30 processed in the apparatus provided on a preceding stage of the main body 10 of the soldering apparatus 100 are carried to the reflow soldering apparatus 100 gradually. On the other hand, in the temperature profile mode, the control unit 50 turns the ready signal off so that the circuit boards 30 processed in the apparatus provided on a preceding stage of the main body 10 of the soldering apparatus 100 are prevented from being carried to the reflow soldering apparatus 100.

Further, when the control unit 50 receives the operation signal Sd, which is used for changing the operation mode to the temperature profile mode, from the operation unit 62, the control unit 62 turns off the stagnant-circuit-board-detection function. The stagnant-circuit-board-detection function is referred to as a function on which an alarm issues to a user by determining that the circuit board 30 is stagnant within the main body 10 of the soldering apparatus 100 if a period of detection time of the circuit board 30 by the sensor 20 of entrance side and the sensor 22 of exit side exceeds a previously set period of detection time. In the temperature profile mode, the conveyor 34 conveys the circuit board 30 which is connected with the temperature profiler circuit board 32. Thus, the sensor 20 of entrance side and the sensor 22 of exit side detect the circuit board 30 and the temperature profiler circuit board 32 continuously so that they may be recognized as one carrying unit, the control unit 50 of the invention turns off the stagnant-circuit-board-detection function and controls the information unit 66 to stop issuing an error alarm even if the period of detection time of the circuit board 30 by the sensor 20 of entrance side and the sensor 22 of exit side exceeds a previously set period of detection time. For example, when detecting the entering and discharging of the circuit board 30, the control unit 50 performs a control such that a detection of any carrying matter following the circuit board 30 is initialized.

Further, when the control unit 50 receives the operation signal Sd, which is used for changing the operation mode to the temperature profile mode, from the operation unit 62, the control unit 62 turns off the fallen-circuit-board-detection function. The fallen-circuit-board-detection function is referred to as a function on which an alarm issues to a user by determining that the circuit board 30 is fallen within the main body 10 of the soldering apparatus 100 if the sensor 22 of exit side cannot detect the circuit board 30 after the sensor 20 of entrance side has detected the circuit board 30. In the temperature profile mode, the sensor 22 of exit side detects the circuit board 30 and the temperature profiler circuit board 32 two times and the sensor 22 of exit side detects the circuit board 30 and the temperature profiler circuit board 32 two times. If, however, the circuit board 30 is taken out when the circuit board 30 reaches the exit 10b, the temperature profiler circuit board 32 is also taken out together with the circuit board 30 so that the sensor 22 of exit side may detect only the circuit board 30 one time. Therefore, the control unit 50 of the invention turns off the fallen-circuit-board-detection function in the temperature profile mode. For example, when the sensor 22 of exit side detects the circuit board 30, the control unit 50 performs a control such that a detection of any carrying matter following the circuit board 30 is invalidated and the detection position is set to an initialization position.

[Configuration Example of Reflow-Soldering-Apparatus-Control Screen]

Figure 3:
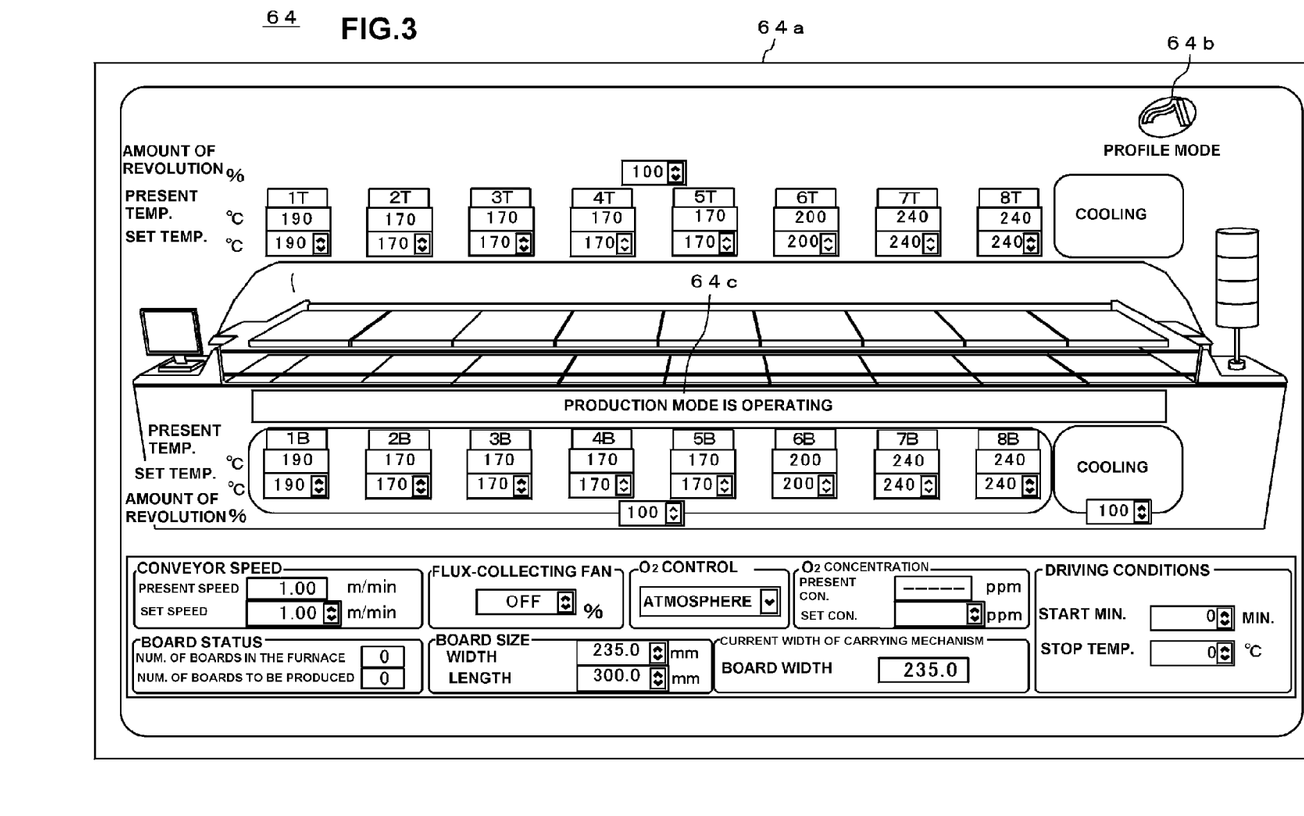
FIG. 3 is a diagram (No. 1) showing a representation example of a control screen of the reflow soldering apparatus in the production mode.
Figure 4:
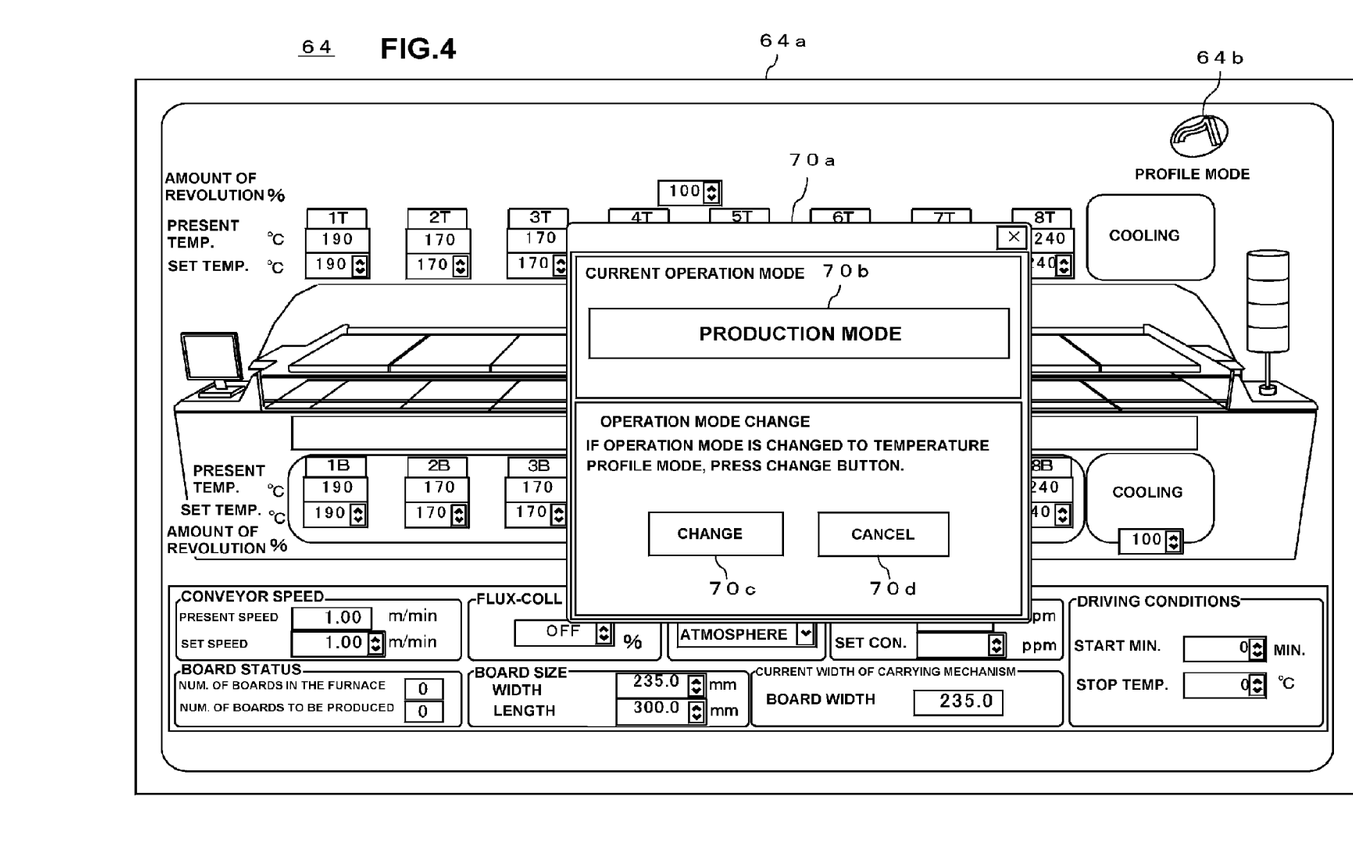
FIG. 4 is a diagram (No. 2) showing the representation example of the control screen of the reflow soldering apparatus in the production mode.
Figure 5:
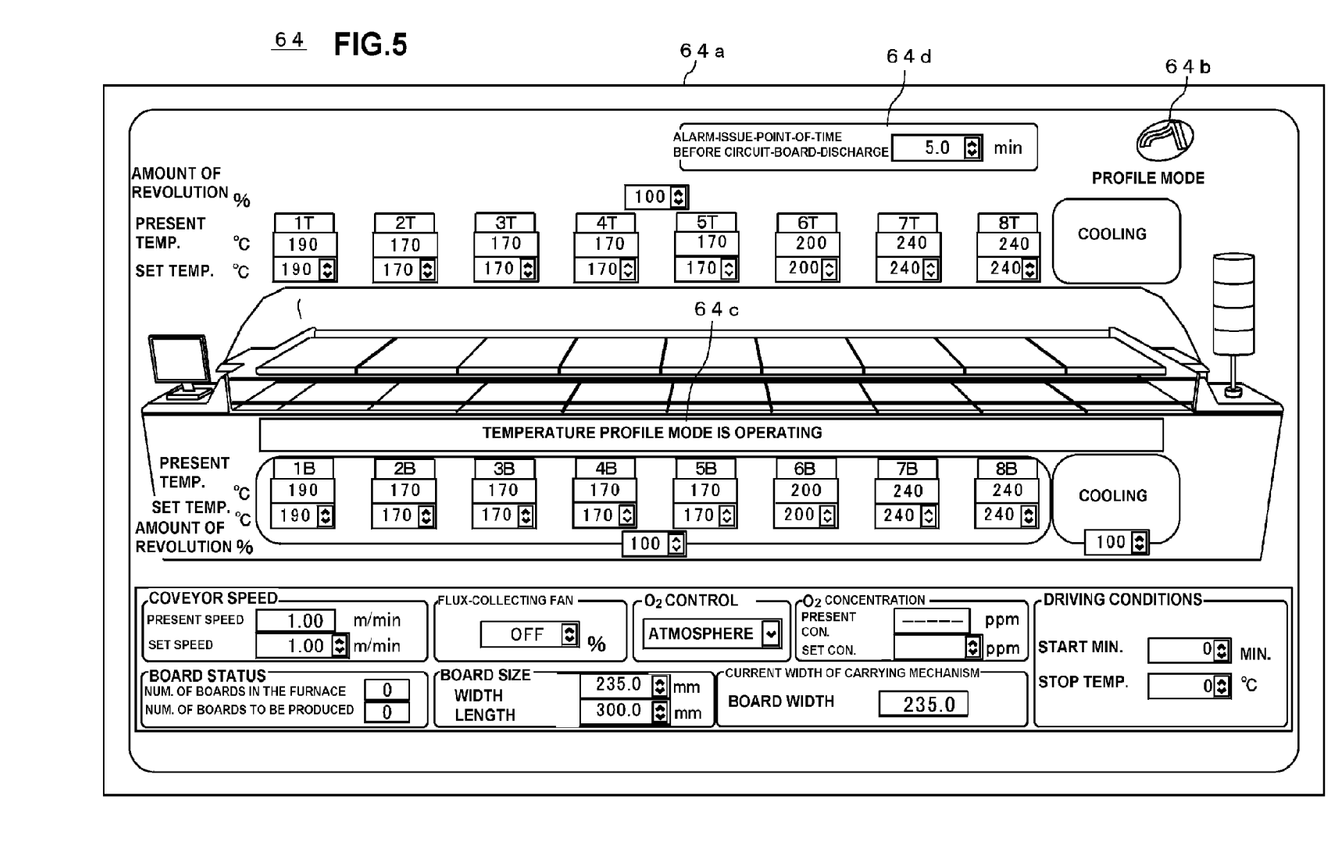
FIG. 5 is a diagram (No. 1) showing a representation example of a control screen of the reflow soldering apparatus in the temperature profile mode.
Figure 6:
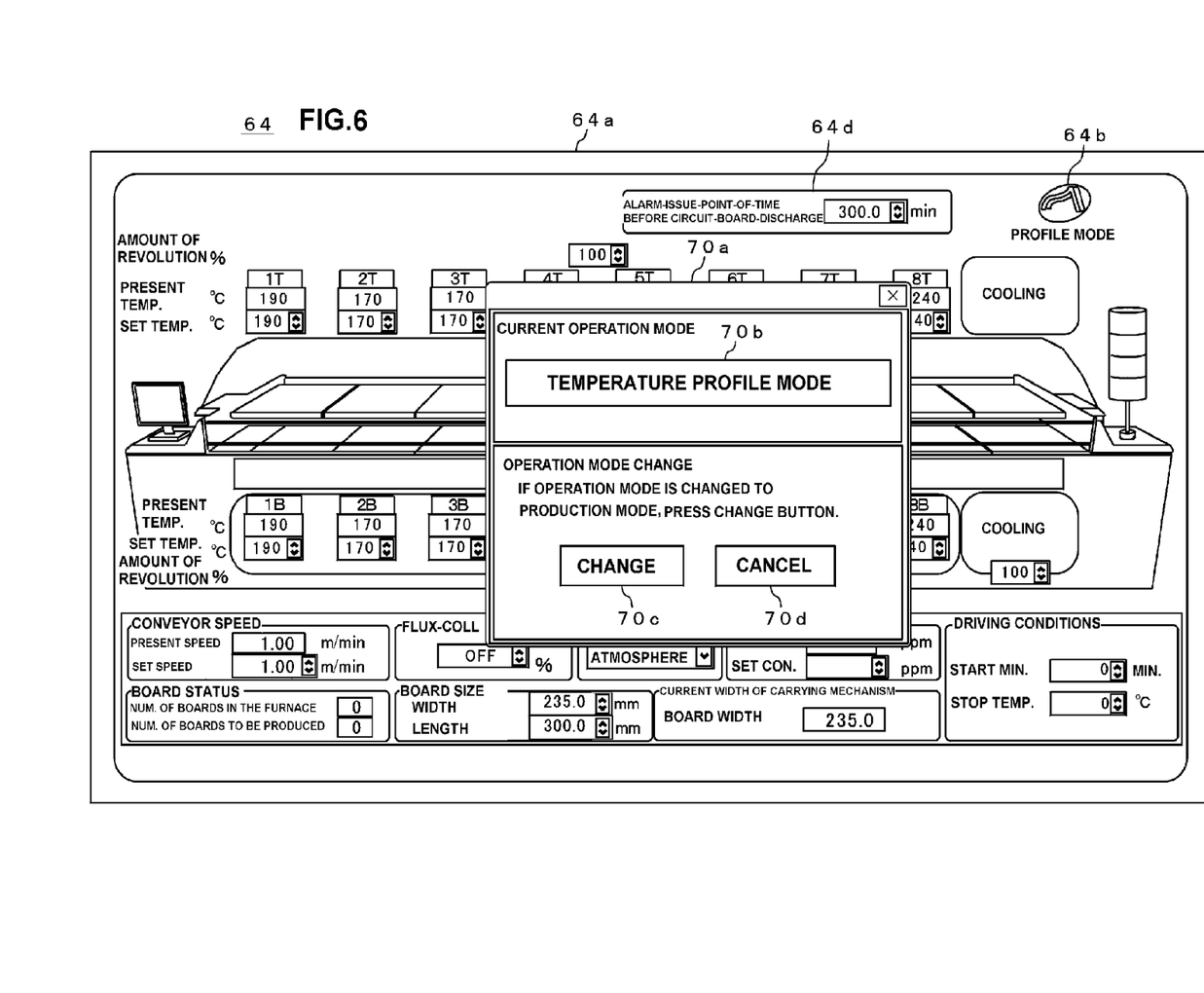
FIG. 6 is a diagram (No. 2) showing the representation example of the control screen of the reflow soldering apparatus in the temperature profile mode.

FIGS. 3 and 4 show a representation example of a control screen displayed on a display unit 64 of the reflow soldering apparatus in the production mode. FIGS. 5 and 6 show a representation example of a control screen displayed on the display unit 64 of the reflow soldering apparatus in the temperature profile mode.

When the reflow soldering apparatus is powered on, the reflow-soldering-apparatus-control screen 64a, as shown in FIG. 3, is displayed on the display unit 64. A present temperature of each zone, a carrying speed of the conveyor 34 and the like are represented on the reflow-soldering-apparatus-control screen 64a. On the reflow-soldering-apparatus-control screen 64a, pairs of up-down control arrow buttons for inputting a numerical value and setting temperature of each zone, an amount of blown air by the fans 14, the carrying speed of the conveyor 34, a circuit board size or the like are provided. The user can input a desired numerical value by performing a touch operation on the up-down control arrow buttons. On almost middle position of an image of the reflow soldering apparatus represented on the reflow-soldering-apparatus-control screen 64a, a mode-information-representing window 64c indicating current operation mode is provided. In this embodiment, since the current operation mode is the production mode, terms, "PRODUCTION MODE IS OPERATING" are represented on the mode-information-representing window 64c.

On an upper and right portion of the reflow-soldering-apparatus-control screen 64a, a profile mode button 64b for changing the operation mode is represented. When pressing the profile mode button 64b to select the temperature profile mode, a pop-up mode-changing sub-screen 70a for changing the operation mode of the reflow soldering apparatus 100 is represented at almost middle position with the sub-screen 70a being overlapped on the reflow-soldering-apparatus-control screen 64a.

On an upper portion of the mode-changing sub-screen 70a, a mode-representing window 70b that represents current operation mode is provided. In this embodiment, since the current operation mode is the production mode, terms, "PRODUCTION MODE" are represented on the mode-presenting window 70b. Below the mode-presenting window 70b, a change button 70c for changing the current operation mode and a cancel button 70d are provided. When the user presses the change button 70c, the operation mode is changed from the production mode to the temperature profile mode. When the user presses the cancel button 70d, the pop-up mode-changing sub-screen 70a is canceled from the reflow-soldering-apparatus-control screen 64a.

The following will describe a representing example when the operation mode of the reflow soldering apparatus 100 is changed from the production mode to the temperature profile mode. When the operation mode is changed to the temperature profile mode in the pop-up mode-changing sub-screen 70a, the pop-up mode-changing sub-screen 70a is deleted from the reflow-soldering-apparatus-control screen 64a, as shown in FIG. 5, after a set period has elapsed. Terms of the changed operation mode is then represented on the mode information representing window 64c of the soldering-apparatus-control screen 64a. In this embodiment, since the operation mode is changed to the temperature profile mode, the terms, "TEMPERATURE PROFILE MODE IS OPERATING" are represented on the mode information representing window 64c. When the operation mode is changed to the temperature profile mode, a pop-up setting window 64d for setting an alarm-issue-point-of-time before circuit-board-discharge, i.e., setting how many seconds does an alarm issues before the circuit board 30 reaches the exit 10b of the main body 10 of the reflow soldering apparatus 100, is represented on an upper portion of the soldering-apparatus-control screen 64a. By operating a pair of up-down control arrow buttons of the pop-up setting window 64d, the user can set desired number of seconds of the alarm-issue-point-of-time Td2 before circuit-board-discharge.

The following will describe a representing example when the operation mode of the reflow soldering apparatus 100 is changed back from the temperature profile mode to the production mode. If the user presses the profile mode button 64b when he changes the operation mode, the pop-up mode-changing sub-screen 70a is represented on almost middle position of the reflow-soldering-apparatus-control screen 64a with the sub-screen 70a being overlapped on the reflow-soldering-apparatus-control screen 64a. In this embodiment, since the current operation mode is the temperature profile mode, the terms, "TEMPERATURE PROFILE MODE" are represented on the mode information representing window 70b of the pop-up mode-changing sub-screen 70a. A change button 70c and a cancel button are the same as those described above so that when pressing the change button 70c, the operation mode is changed from the temperature profile mode to the production mode and the screen returns to the reflow-soldering-apparatus-control screen 64a, which is an initial screen. When the user presses the cancel button 70d, the pop-up mode-changing sub-screen 70a is canceled from the reflow-soldering-apparatus-control screen 64a.

[Operation Example of Reflow Soldering Apparatus]

Figure 7:
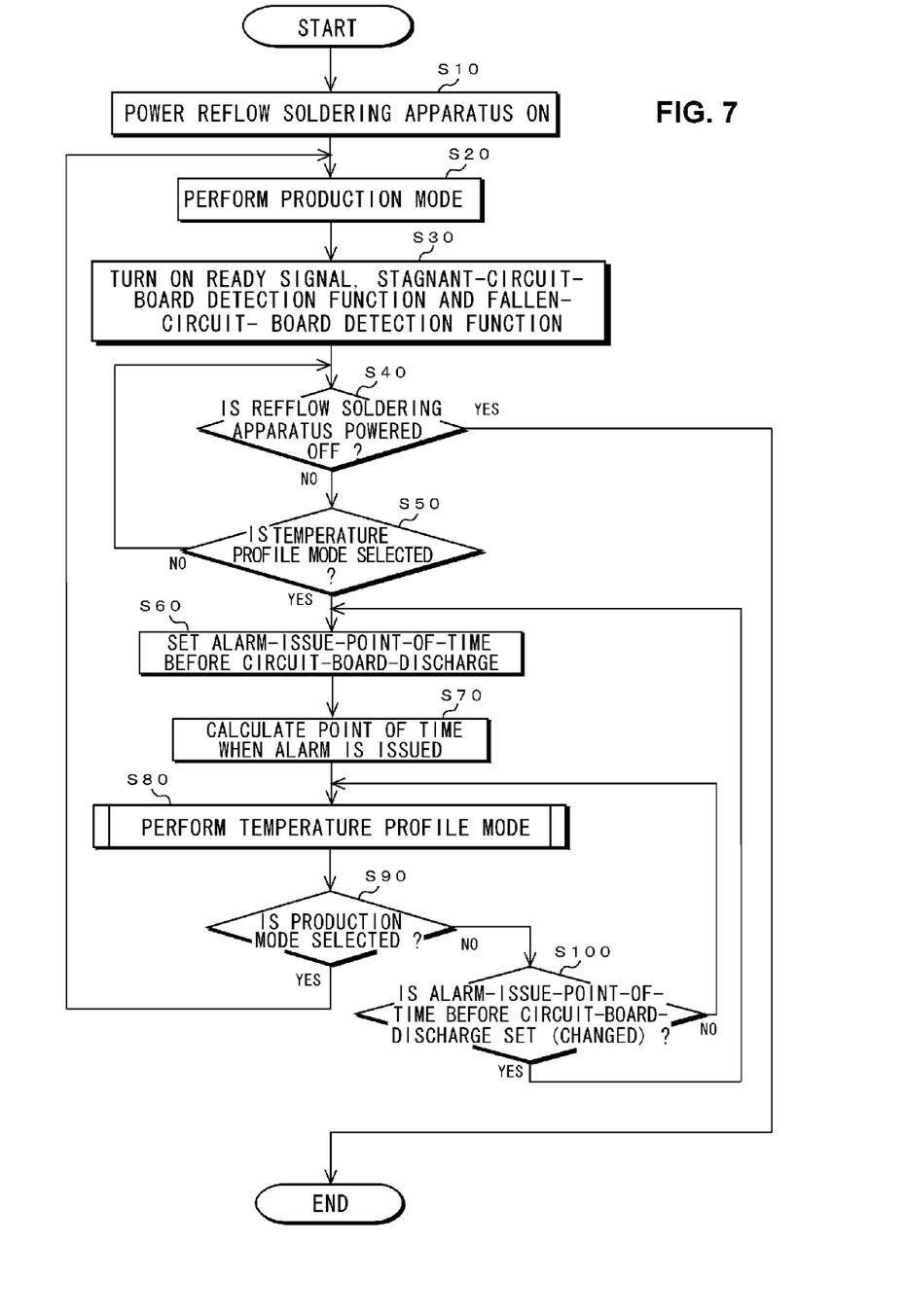
FIG. 7 is a flowchart showing an operation example of the reflow soldering apparatus.

The following will describe an operation example of the reflow soldering apparatus 100 according to the invention. FIG. 7 is a flowchart showing the operation example of the reflow soldering apparatus 100. It is to be noted that in the following description, the operation mode of the reflow soldering apparatus 100 is set to the production mode at an initial state in which the reflow soldering apparatus 100 is powered on.

As shown in FIG. 7, at step S10, the user powers the reflow soldering apparatus 100 on. The control unit 50 determines which the reflow soldering apparatus 100 is powered on or off according to whether or not a power switch provided on the reflow soldering apparatus 100 is switched on. If the reflow soldering apparatus 100 is powered on and starts the operation thereof, then the operation goes to step S20.

At the step S20, the control unit 50 performs the production mode. At the step S30, in the production mode, the control unit 50 turns on a ready signal which is supplied to an apparatus of a preceding stage of the reflow soldering apparatus 100, the stagnant-circuit-board-detection function and the fallen-circuit-board-detection function. The circuit board 30 carried from the apparatus of the preceding stage of the reflow soldering apparatus 100 via the conveyor is then subjected on the preliminary heating process, the main heating process and the cooling process, so that the solder paste on the circuit board 30 is melted and the electronic components are jointed to joints of the circuit board 30.

At the step S40, the control unit 50 determines whether or not the reflow soldering apparatus 100 is powered off. If the control unit 50 determines that the reflow soldering apparatus 100 is powered off, then the control unit 50 turns off the ready signal, the stagnant-circuit-board-detection function and the fallen-circuit-board-detection function and completes a series of processing of the production mode. On the other hand, if the control unit 50 determines that the reflow soldering apparatus 100 is not powered off, then the operation goes to a step S50.

At the step S50, the control unit 50 determines whether or not the temperature profile mode is selected. As shown in FIG. 4, by the operation of the profile mode button 64b in the reflow-soldering-apparatus-control screen 64a or the operation of the change button 70c of the pop-up mode-changing sub-screen 70a, the control unit 50 determines whether or not the operation mode is changed from the production mode to the temperature profile mode. If the control unit 50 determines that the operation mode is changed to the temperature profile mode, then the operation goes to a step S60. On the other hand, if the control unit 50 determines that the operation mode is not changed to the temperature profile mode, then the operation returns to the step S40 where the production mode is still performed.

If the operation mode is changed to the temperature profile mode, then the alarm-issue-point-of-time Td2 before circuit-board-discharge is set at the step S60. Namely, it is set how many seconds does an alarm issue before the discharge time T2 when the circuit board 30 is discharged from the exit 10b of the main body 10 of the reflow soldering apparatus 100. For example, the alarm-issue-point-of-time Td2 before circuit-board-discharge can be set by operating a pair of up-down control arrow buttons (operation unit) of the pop-up setting window 64d on the reflow-soldering-apparatus-control screen 64a displayed on the display unit 64 shown in FIG. 5 and inputting a desired number of seconds of the alarm-issue-point-of-time Td2 before circuit-board-discharge. The alarm-issue-point-of-time Td2 before circuit-board-discharge is then stored in a memory and read out of the memory when calculating a point of time Td3 when the alarm issues, which will be described later, and used.

At a step S70, then the control unit 50 calculates the point of time Td3 when the alarm issues. The control unit 50 first obtains the alarm-issue-point-of-time Td2 before circuit-board-discharge set in the step S60. Next, the control unit 50 calculates whole carrying time Td1 of the circuit board 30 from the entrance 10a of the main body 10 of the reflow soldering apparatus 100 up to the exit 10b thereof based on a carrying distance and a carrying speed of the circuit board 30. The carrying distance of the circuit board 30 is a distance D between the entrance 10a (providing with the sensor 20 of entrance side) and the exit 10b (providing with the sensor 22 of exit side) (see FIG. 1). For example, a value of distance D based on a designed value thereof is previously stored on the memory. The carrying speed of the circuit board 30 is a carrying speed of the circuit board 30 between the entrance 10a and the exit 10b. For example, the carrying speed of the circuit board 30 is obtained from input value of an item of a conveyor speed of the soldering-apparatus-control screen 64a.

The control unit 50 calculates the point of time Td3 when the alarm issues by subtracting the alarm-issue-point-of-time Td2 before circuit-board-discharge from the whole carrying time Td1. The point of time Td3 when the alarm issues is also a period from a detection time T1 when the sensor 20 of entrance side detects the circuit board 30 to a point of time when the alarm issues and a time earlier than the discharge time T2 when the circuit board 30 is discharged from the exit 10b of the main body 10 of the reflow soldering apparatus 100. After the calculation is finished, the circuit board 30 connecting with the temperature profiler circuit board 32 is practically entered into the main body 10 of the reflow soldering apparatus 100 so that a measurement of a temperature profile starts, which will be described later. It is to be noted that the setting of the alarm-issue-point-of-time Td2 before circuit-board-discharge, the calculation of the point of time Td3 when the alarm issues, the setting and/or change of the alarm-issue-point-of-time Td2 before circuit-board-discharge and the like may be carried out in the production mode, other than the temperature profile mode.

Figure 8:
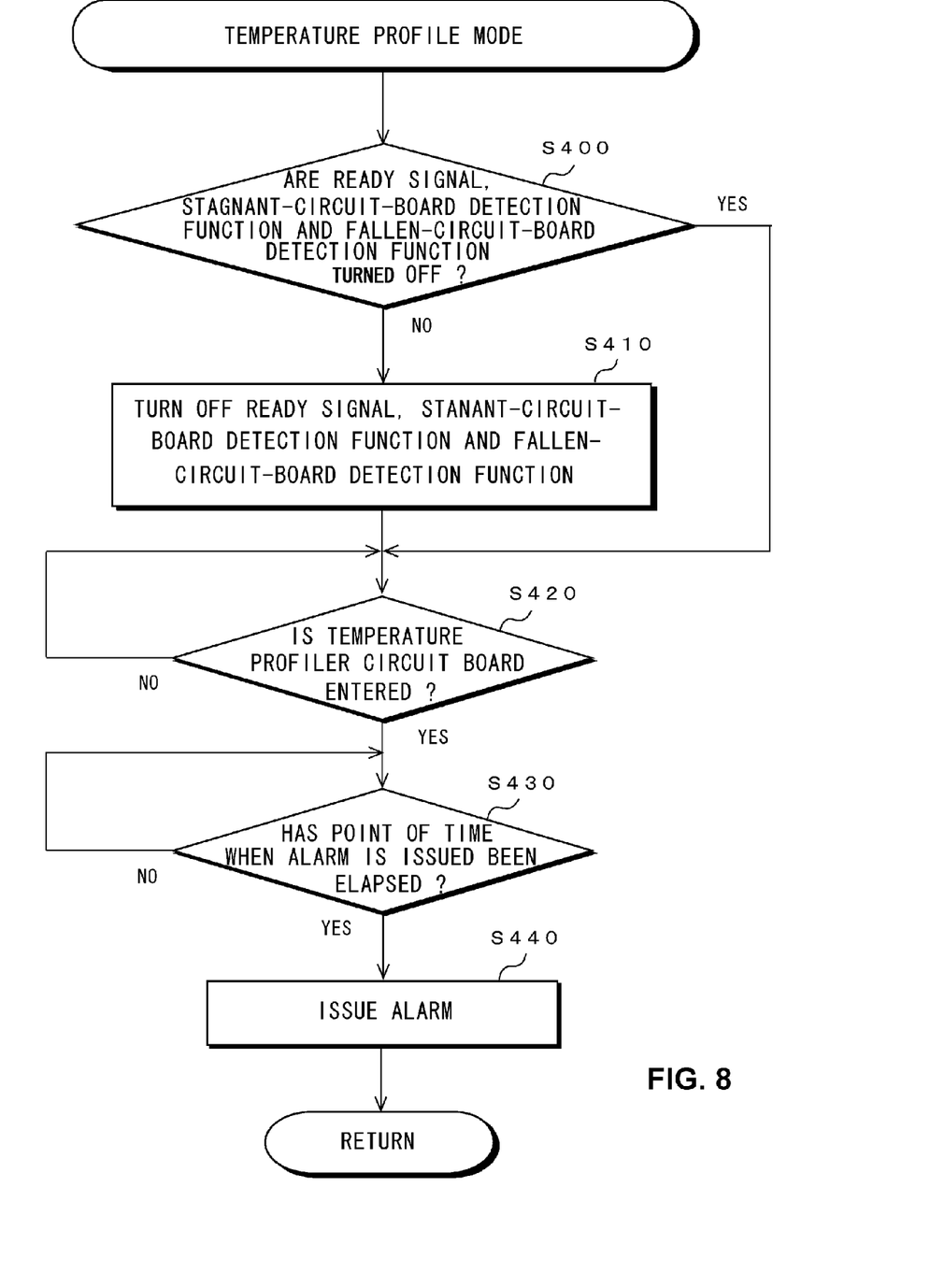
FIG. 8 is a flowchart showing an operation example of the reflow soldering apparatus during the temperature profile mode.
Figure 9A:
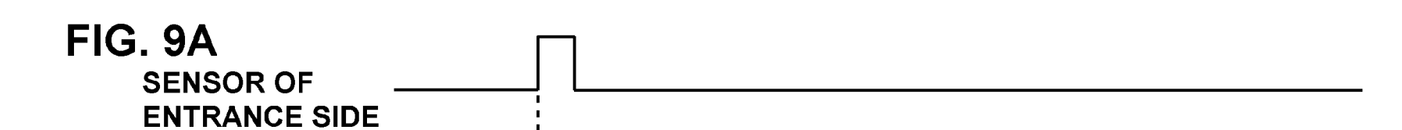
FIGS. 9A through 9C are diagrams of a timing chart showing an operation example of the reflow soldering apparatus during the temperature profile mode.
Figure 9B:
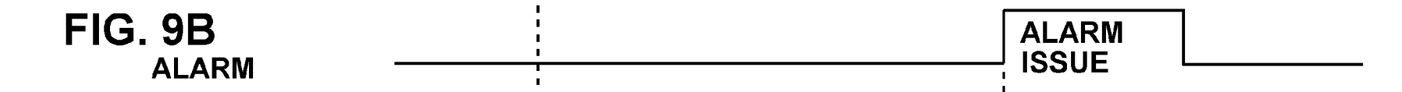
Figure 9C:
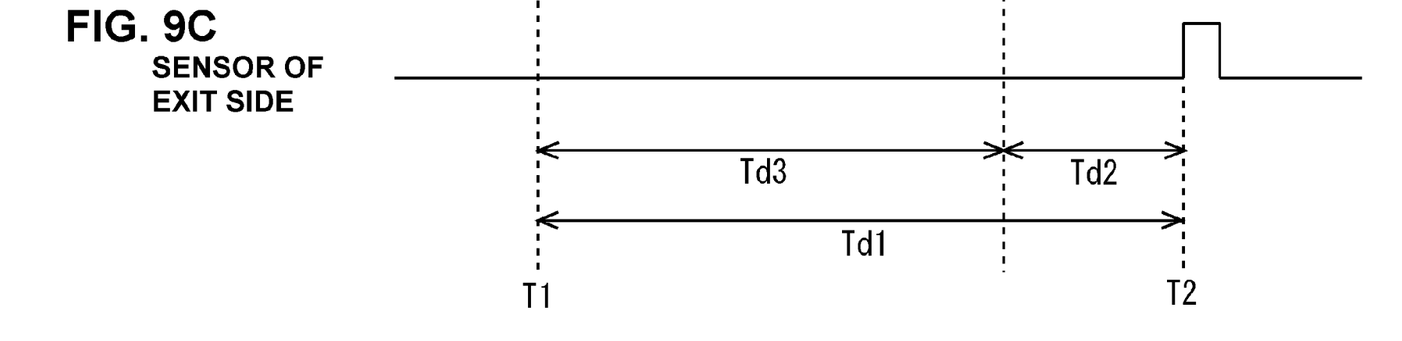

The operation then goes to a step S80 where the temperature profile mode is performed. In the temperature profile mode, the operation goes to a subroutine shown in FIG. 8 to perform the temperature profile mode. FIG. 8 is a flowchart showing an operation example of the reflow soldering apparatus during the temperature profile mode. FIGS. 9A through 9C are diagrams of a timing chart showing an operation example of the reflow soldering apparatus during the temperature profile mode. As shown in FIG. 8, when the operation mode is changed to the temperature profile mode, the control unit 50 determines whether or not the ready signal which is supplied to an apparatus of a preceding stage of the reflow soldering apparatus 100, the stagnant-circuit-board-detection function and the fallen-circuit-board-detection function are turned off at a step S400. If the control unit 50 determines that the ready signal, the stagnant-circuit-board-detection function and the fallen-circuit-board-detection function are turned off, then the operation goes to a step S420. If the control unit 50 determines that the ready signal, the stagnant-circuit-board-detection function and the fallen-circuit-board-detection function are not turned off, then the operation goes to a step S410.

At the step S410, the control unit 50 turns the ready signal off. This prevents the circuit board 30 for production from being carried in error from the apparatus of the preceding stage of the reflow soldering apparatus 100. The control unit 50 also turns off the stagnant-circuit-board-detection function and the fallen-circuit-board-detection function. This prevents error alarm from issuing based on a mistake of the detection of the circuit board 30 in the temperature profile mode.

After these settings are finished, the circuit board 30 connecting with the temperature profiler circuit board 32 is practically entered into the main body 10 of the reflow soldering apparatus 100 so that a measurement of a temperature profile starts.

At a step S420, the control unit 50 determines whether or not the sensor 20 of entrance side detects the circuit board 30 (see FIG. 9A). If the control unit 50 determines that the sensor 20 of entrance side detects the circuit board 30, then the operation goes to a step S430. If the control unit 50 determines that the sensor 20 of entrance side does not detect the circuit board 30, then the control unit 50 waits until the circuit board 30 is entered into the main body 10 of the reflow soldering apparatus 100.

At the step S430, the control unit 50 determines whether or not a period from the detected time (entered time) of the circuit board 30 to the point of time Td3 when the alarm issues has elapsed. The control unit 50 starts counting time from the detection time T1 of the circuit board 30 when the sensor 20 of entrance side detects the circuit board 30 and determines whether or not a period from the detected time (entered time) of the circuit board 30 to the point of time Td3 when the alarm issues has elapsed. If the control unit 50 determines that the period from the detected time (entered time) of the circuit board 30 to the point of time Td3 when the alarm issues has elapsed, then the operation goes to a step S440. If the control unit 50 determines that the period from the detected time (entered time) of the circuit board 30 to the point of time Td3 when the alarm issues has not yet elapsed, then the control unit 50 keeps counting the time until the period from the detected time (entered time) of the circuit board 30 to the point of time Td3 when the alarm issues has elapsed.

At the step S440, the control unit 50 supplies the output signal Sc to the information unit 66 which issues the alarm (see FIG. 9B). The alarm may stop at a point of time when the sensor 22 of exit side detects the circuit board 30 as shown in FIGS. 9B and 9C. The alarm may issue continuously or intermittently. The user can be informed that the circuit board 30 is coming up to the exit 10b of the main body 10 of the soldering apparatus 100 by hearing the alarm so that when the user may take the circuit board 30 out of the main body 10 of the soldering apparatus 100 surely when the circuit board 30 reaches the exit 10b thereof (before the circuit board 30 is carried to an apparatus of a next step).

After the information by the alarm has been finished, the operation returns to a step S90, shown in FIG. 7, where the control unit 50 determines whether or not the operation mode is changed from the temperature profile mode to the production mode on the reflow-soldering-apparatus-control screen 64a. If the control unit 50 determines that the operation mode is changed to the production mode, then the operation goes to the step S20. If the control unit 50 determines that the operation mode is not changed to the production mode, then the operation goes to a step S100. At the step S100, the control unit 50 determines whether or not any operation for changing the setting of the alarm-issue-point-of-time Td2 before circuit-board-discharge is carried out. If the setting of the alarm-issue-point-of-time Td2 before circuit-board-discharge is not changed in the temperature profile mode, the previously set alarm-issue-point-of-time Td2 can be used as it is so that the alarm-issue-point-of-time Td2 may be not required to be input. In this case, the operation goes to the step S80 where the above-mentioned temperature profile mode (from the step S400 to the step S440) is continuously carried out. On the other hand, if the setting of the alarm-issue-point-of-time Td2 before circuit-board-discharge is changed, the operation returns to the step S60 where the alarm-issue-point-of-time Td2 before circuit-board-discharge is set. At the step S70, the point of time Td3 when the alarm issues is then calculated and at the steps S400 through S440, the above-mentioned temperature profile mode is carried out.

If the control unit 50 determines that the operation mode is changed to the production mode at the step S90, then the operation returns to the step S20 where the operation mode is performed and at the step S30, the control unit 50 turns on the ready signal which is supplied to the apparatus of the preceding stage of the reflow soldering apparatus 100. This enables the apparatus of the preceding stage of the reflow soldering apparatus 100 to know that the circuit board 30 is allowed to be carried. Thus, the apparatus of the preceding stage of the reflow soldering apparatus 100 carries the circuit board 30 processed thereby to the reflow soldering apparatus 100. When the operation mode of the reflow soldering apparatus 100 is changed to the production mode, the control unit 50 turns on the stagnant-circuit-board-detection function and the fallen-circuit-board-detection function. This enables the warning to be informed to the user by an alarm when the circuit board 30 is stagnant or fallen in the reflow soldering apparatus 100.

After the operation of the step S30 is finished, the operation goes to following steps where the processing in the above-mentioned production mode or temperature profile mode is carried out. In this embodiment, such a series of operations is carried out over and over.

Thus, according to the embodiment of the reflow soldering apparatus 100 of the invention, in the temperature profile mode, the alarm such as a buzzer issues before the circuit board 30 reaches the exit 10b of the main body 10 of the reflow soldering apparatus 100 so that the user can know that the circuit board 30 is coming up to the exit 10b of the main body 10 of the soldering apparatus 100. This enables the circuit board 30 to be taken out of the main body 10 of the soldering apparatus 100 surely by the user moved to the exit 10b thereof, thereby preventing the circuit board 30 from being inadvertently discharged to the next step or being fallen.

For example, if an alarm issues based on the detection of the circuit board 30 by the sensor 22 of exit side when the circuit board 30 reaches the exit 10b and the user works at a position away from the reflow soldering apparatus 100, the circuit board 30 may have been already carried to the next step when the user returns to the exit 10b. However, according to the embodiment of the reflow soldering apparatus 100 of the invention, as described above, the alarm issues before the circuit board 30 reaches the exit 10b of the main body 10 of the reflow soldering apparatus 100. This prevents the circuit board 30 from being inadvertently discharged to the next step.

According to the embodiment of the reflow soldering apparatus 100 of the invention, the control unit 50 calculates the point of time Td3 when the alarm issues by setting the alarm-issue-point-of-time Td2 before circuit-board-discharge, indicating how many time (seconds) does the alarm issue before the circuit board reaches the exit 10b of the main body of the soldering apparatus. This enables the information unit 66 to issue the alarm without any sensor being mounted on an alarm-issue-position, thereby reducing the cost.

According to the embodiment of the reflow soldering apparatus 100 of the invention, the control unit 50 turns the ready signal off when the operation mode is changed to the temperature profile mode so that it is possible to prevent the circuit board 30 for production from entering into the main body 10 of the soldering apparatus 100 in error from the apparatus of the preceding step in the temperature profile mode.

According to the embodiment of the reflow soldering apparatus 100 of the invention, the control unit 50 turns off the stagnant-circuit-board detection function and the fallen-circuit-board detection function when the operation mode is changed to the temperature profile mode so that it is possible to prevent the error alarm from issuing by the mistake in the detection of the circuit board 30 and the temperature profiler circuit board 32. This enables any mistakes in the measurement to be decreased, thereby allowing the measurement of the temperature profile to be rapidly and effectively carried out.

The invention is not limited to the above-mentioned embodiments and it should be understood by those skilled in the art that various modifications, combinations, sub-combinations and alterations may occur depending on design requirements and other factors insofar as they are within the scope of the appended claims or the equivalents thereof. Although it has been described in the above-mentioned embodiment that the invention is applied to the reflow soldering apparatus 100, the invention is not limited thereto. For example, of course, this invention may be also applied to a soldering apparatus (for flow soldering), in which an electronic components are soldered by adhering the solder on joint portions on which the electronic components are mounted by passing the circuit board on a solder bath in which melted solder is filled.

When the temperature profile mode is carried out, the circuit board 30 may be stagnant or fallen within the main body 10 of the soldering apparatus 100. In this case, the time from the detection of the circuit board 30 by the sensor 20 of entrance side up to the detection thereof by the sensor 22 of exit side can be obtained from the above-mentioned whole carrying time Td1 of the circuit board 30. An error alarm may issue as the detection of the stagnant or fallen circuit board 30 when the sensor 22 of exit side cannot detect the circuit board 30 even if the whole carrying time Td1 has been elapsed.

Although it has been described in the above-mentioned embodiment that the alarm-issue-point-of-time Td2 before the circuit board reaches the exit 10b of the main body 10 of the soldering apparatus 100 is set, the point of time Td3 when the alarm issues may be directly set because the carrying time in whole length of the main body 10 of the soldering apparatus 100 is previously obtained by calculation. In this case, the above-mentioned calculation is unnecessary so that processing time may be reduced.

What is claimed is:

1. A soldering apparatus having an operation mode that includes a production mode that solders an electronic component on a circuit board and a temperature profile mode that measures a temperature of the circuit board carried in a main body of the soldering apparatus, in the temperature profile mode, the apparatus comprising:
the main body;
an information means that informs warning;
an operation unit that sets a starting time of the warning to be issued by the information means;
a sensor that detects the circuit board carried into the main body of the soldering apparatus, the sensor being provided near an entrance of the main body of the soldering apparatus; and
a control unit that determines whether or not the starting time of the warning issue by the information means, the starting time being set by the operation unit, has come, on the basis of a detection result detected by the sensor,
wherein the starting time of the warning issue by the information means includes a warning-issue-point-of-time before circuit-board-discharge indicating a point of time when the warning issues before the circuit board reaches an exit of the main body of the soldering apparatus, and
the control unit calculates a point of time when the warning is issued based on the warning-issue-point-of-time, a carrying speed of the circuit board and a carrying distance in the main body of the soldering apparatus, and
in the temperature profile mode, the control unit controls the information means to issue the warning when the control unit determines that the starting time of the warning issue has come.

2. The soldering apparatus according to claim 1, wherein the control unit determines whether the operation mode is the production mode or the temperature profile mode,
if the control unit determines that the operation mode is the production mode, then the control unit turns a ready signal on, the ready signal indicating whether or not the circuit board supplied from a stage preceding the main body of the soldering apparatus is allowed to be carried, and
if the control unit determines that the operation mode is the temperature profile mode, then the control unit turns the ready signal off.

3. The soldering apparatus according to claim 1, further comprising a display unit that displays an operation-controlling screen for setting each part of the main body of the soldering apparatus,
wherein the control unit controls the display unit to display an operation-mode-changing screen that allows a user to select the production mode or the temperature profile mode, as the operation-controlling screen displayed on the display unit.

4. The soldering apparatus according to claim 1, wherein the control unit contains a stagnant-circuit-board-detection function that informs a user that the circuit board has been stagnant within the main body of the soldering apparatus when the circuit board has been stagnant within the main body of the soldering apparatus in the production mode, and
the control unit turns the stagnant-circuit-board-detection function off when changing the operation mode of the main body of the soldering apparatus to the temperature profile mode.

5. The soldering apparatus according to claim 1, wherein the control unit contains a fallen-circuit-board-detection function that informs a user that the circuit board has fallen from a conveying way within the main body of the soldering apparatus when the circuit board has fallen from the conveying way in the production mode, and
the control unit turns the fallen-circuit-board-detection function off when changing the operation mode of the main body of the soldering apparatus to the temperature profile mode.

6. A soldering apparatus comprising:
a main body having an entrance and an exit,
a conveyer for carrying a circuit board into and through the main body from the entrance of the main body to the exit of the main body,
a sensor that detects the circuit board carried into the main body of the soldering apparatus, the sensor being provided near the entrance of the main body,
an information unit that issues a warning,
an operation unit for entering operating commands from a user, and
a programmed control unit responsive to an operating command entered by the user to operate the soldering apparatus selectively either in a production mode or in a temperature profile mode,
and wherein, in the temperature profile mode, the control unit operates the soldering apparatus automatically in accordance with a method that comprises:
receiving a value of a warning-issue-point-of-time before circuit-board-discharge indicating a point of time before the circuit board reaches the exit of the main body when the information unit should issue a warning,
calculating a point of time when the warning should be issued based on a time at which the sensor detects the circuit board, the value of the warning-issue-point-of-time, a carrying speed of the circuit board, and a carrying distance in the main body of the soldering apparatus,
determining whether the point of time when the warning should be issued has come based on the sensor detecting the circuit board, and
controlling the information means to issue the warning when the point of time when the warning should be issued has come.

7. The soldering apparatus according to claim 6, wherein, in operation of the soldering apparatus, the control unit determines whether the apparatus is operating in the operation mode or in the temperature profile mode,
if the control unit determines that the apparatus is operating in the production mode, then the control unit asserts a ready signal in an "on" state indicating that the circuit board supplied from a stage preceding the main body of the soldering apparatus is allowed to be carried by the conveyor of the soldering apparatus, and
if the control unit determines that the operation mode is the temperature profile mode, then the control unit asserts the ready signal in an "off" state indicating that the circuit board supplied from the stage preceding the main body of the soldering apparatus is not allowed to be carried by the conveyor of the soldering apparatus.

8. The soldering apparatus according to claim 6, further comprising a display unit that displays an operation-controlling screen for setting operating conditions of parts of the main body of the soldering apparatus,
and wherein the control unit controls the display unit to display an operation-mode-changing screen that allowing a user to select the production mode or the temperature profile mode, as the operation-controlling screen displayed on the display unit.

9. The soldering apparatus according to claim 6, wherein the control unit contains a stagnant-circuit-board-detection function that informs a user that the circuit board has been stagnant within the main body of the soldering apparatus when the circuit board has been stagnant within the main body of the soldering apparatus in the production mode, and the control unit turns the stagnant-circuit-board-detection function off when changing the operation mode of the main body of the soldering apparatus to the temperature profile mode.

10. The soldering apparatus according to claim 9, wherein the sensor that detects the circuit board carried into the main body of the soldering apparatus is a first sensor, the apparatus comprises a second sensor that detects the circuit board carried from the main body of the soldering apparatus, the second sensor being provided near the exit of the main body, and the stagnant-circuit-board-detection function of the control unit is responsive to a time between the first sensor detecting the circuit board carried into the main body and the second sensor detecting the circuit board carried from the main body exceeding a predetermined detection time.

11. The soldering apparatus according to claim 6, wherein the control unit contains a fallen-circuit-board-detection function that informs a user that the circuit board has fallen from a conveying way within the main body of the soldering apparatus when the circuit board has fallen from the conveying way in the production mode, and the control unit turns the fallen-circuit-board-detection function off when changing the operation mode of the main body of the soldering apparatus to the temperature profile mode.

12. The soldering apparatus according to claim 6, wherein the control unit comprises a processing unit and a storage device that contains at least one program which, when carried out by the processing unit, causes the control unit to operate the apparatus selectively either in the production mode or in the temperature profile mode.

* * * * *